United States Patent [19]

Peter

[11] 4,336,861

[45] * Jun. 29, 1982

[54] SPEAKER SYSTEM

[76] Inventor: B. Keith Peter, 1200 Valley Rd., Deerfield, Ill. 60015

[ * ] Notice: The portion of the term of this patent subsequent to Nov. 29, 1994, has been disclaimed.

[21] Appl. No.: 283,069

[22] Filed: Aug. 23, 1972

[51] Int. Cl.[3] .......................... H04R 7/00; H05K 5/00

[52] U.S. Cl. .................................... 181/144; 181/151; 181/152; 181/155

[58] Field of Search ..................... 181/31 B, 152, 155, 181/156, 159, 164, 165, 185, 194, 144–146

[56] References Cited

U.S. PATENT DOCUMENTS

| | | | |
|---|---|---|---|
| 2,058,208 | 10/1936 | Blattner | 181/159 |
| 2,206,427 | 7/1940 | Preston | 181/152 |
| 2,801,703 | 8/1957 | Martin | 181/152 |
| 3,047,090 | 7/1962 | Pruden | 181/152 |
| 3,412,824 | 11/1968 | Armstrong | 181/31 B |
| 3,477,540 | 11/1969 | Patron | 181/31 B |
| 3,816,672 | 6/1974 | Gefvert et al. | 179/115.5 R |

*Primary Examiner*—L. T. Hix
*Assistant Examiner*—Benjamin R. Fuller
*Attorney, Agent, or Firm*—Burmeister, York, Palmatier, Hamby & Jones

[57] ABSTRACT

An improved, compact speaker system for production of the full range of sound audible to the human ear, the sound radiating from the speaker being omnidirectional with the speaker including an outer cabinet shell and a defined chamber configuration within the shell. High and low frequency speakers are mounted within the cabinet shell with an acoustical path being defined within the cabinet for the low frequency wavelengths with the low frequency tones traveling within the cabinet for a distance of 1/12 the wavelength of the natural free air resonance of the low frequency speaker. The high frequency speaker having a slug of pre-determined surface configuration to permit omnidirectional sound radiation without distortion.

5 Claims, 8 Drawing Figures

SPEAKER SYSTEM

The present invention relates to an improved, compact full range speaker system employing at least two speakers and having a cabinet defined in part, as a function of the characteristic natural free air resonance of the low frequency speaker employed in the system.

Conventional speaker systems usually are not designed to produce omnidirectional sound radiating characteristics. Generally, it is not intended that they provide audible sound waves of a given volume at various frequencies to produce substantially equal volume, without distortion, when measured radially from the speaker. Moreover, many speaker systems are not designed to produce a flat response over the frequency range normally audible to humans.

One of the means commonly employed in the design of omnidirectional speaker systems resides in the use of various sound reflectors to divert the sound radially outwardly with respect to the speaker. This, of course, results in distortion of the sound since the reflecting path commonly is not a multiple of the full range of wavelengths emanating from the speaker. This distortion is detectable by the human ear and the result is a tone that generally is not pleasant.

Most attempts to obtain omnidirectional radiation of sound from a speaker have been with the use of dispersion devices or multiple speaker systems. All such devices and systems have characteristic high distortion levels at various frequencies.

The present invention is directed to the provision of an improved, compact omnidirectional speaker system which does not have the distortion characteristics of earlier speaker systems and which is capable of producing the full range of audible frequencies.

It is accordingly, a general object of the present invention to provide an improved, compact omnidirectional speaker system for the production of the full range of audible frequencies without distortion of any given frequency or range of frequencies.

Other objects of the present invention reside in the provision of an improved, compact omnidirectional speaker system wherein the speaker cabinet is designed as a function of the natural free air resonance of the low frequency speaker; wherein the speaker cabinet is provided with defined chambers and with the speakers mounted in association with one chamber which defines an acoustical path for low frequency tones; wherein the speaker system is relatively inexpensive to manufacture; wherein the cabinet may be manufactured of relatively inexpensive acoustical materials; wherein the speaker system is adapted for ease of maintenance in use and wherein sound production is realized without distortion from about 20 Hz to about 20,000 Hz.

The novel features which I believe to be characteristic of my invention are set forth with particularity in the appended claims. My invention itself, however, together with further objects and advantages thereof will best be understood by reference to the following description taken in connection with the accompanying drawings, in which:

Figure 1:
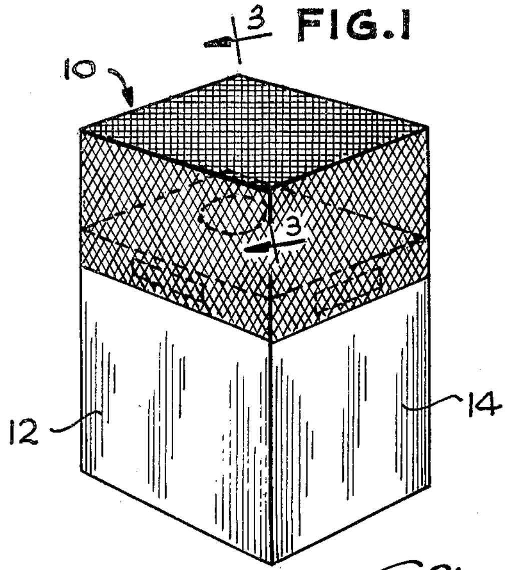
FIG. 1 is a perspective view representing one form of loudspeaker system constructed according to the present invention.
Figure 2:
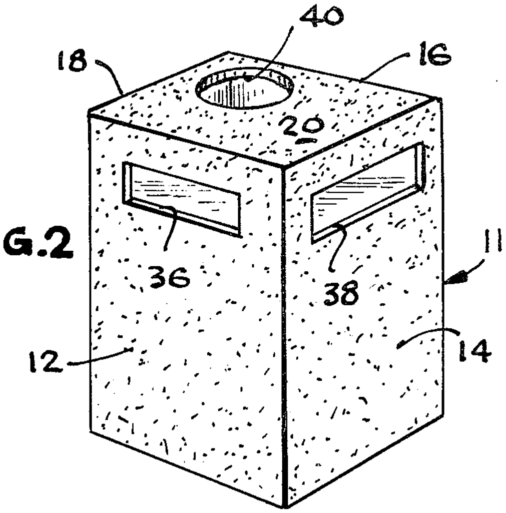
FIG. 2 is a perspective view of the cabinet of FIG. 1 without the covering or finishing materials thereon, and with the speaker chamber omitted illustrating the exterior configuration and design of the speaker cabinet.

Sound is a mechanical disturbance of air particles. Under predetermined conditions sound is propagated at about 1100 feet per second. Accordingly, to determine speaker cabinet dimensions, baffle size, minimum room dimensions for a speaker system, filter dimensions, and the like, the wave length can be computed with the standard formula:

$$\lambda = 1100/f$$

where $\lambda$ = the wave length in feet and f = the frequency in cycles per second.

The audible-response spectrum for humans generally is considered to be 20 to 20,000 cycles per second. It should be noted, however, that for many people the upper limit is somewhat lower.

In acoustics, distortion is a change in wave form. Noise and certain desired changes in wave forms, such as those resulting from modulation or detection, are not usually classed as distortion.

A speaker system, or loudspeaker, is an electroacoustical device which converts electrical current variations into sound. The speaker, by itself, is only a part of a speaker system and is often called the driver unit. The speaker system includes a housing or cabinet for proper performance to enhance the bass response and reduce distortion. The housing augments the speaker or driver unit in reproducing true notes or sounds.

There have been many proposals advanced for enclosures for speaker systems. Most are adequate for specific end uses or pre-determined frequency ranges. Others are generally acceptable for full range production of audible sound but have the disadvantage of being sophisticated, and therefore expensive, or very large in physical size and thus not acceptable for small rooms or enclosures.

The concept disclosed and claimed here is directed to the provision of a means to establish a practical method for defining low frequency loading down to, for example, the region of 20 Hz. It should be noted that most compact, or so-called bookshelf, enclosures have resonances in the vicinity of 50 to 90 Hz which, of course, limits the use of speaker systems with such enclosures. That is, such speaker systems may not be employed for reproduction of any frequencies below about 100 Hz which, of course, leaves a substantial void with regard to bass tones. A substantial portion of the rhythm and accompaniment tones are in the 30 to 100 Hz region and present compact speakers do not reproduce these tones without resonance distortion. The concept disclosed herein is directed to elimination or minimizing these resonances while still providing a compact cabinet dimension suitable for use in the home.

I accomplish the characteristic operation of my speaker system, among other aspects, by the use of an open-end tube of a length equal to 1/12 wavelength of the free air resonance of the low frequency speaker acoustically coupled to the cone of a cone type driver unit, and by providing an appropriate acoustical resistance member within the tube. In this manner resonance is damped to the point where it does not interfere with reproduction of pure sounds without distortion. This permits use of the speaker at frequencies down to about 20 Hz with real pitch and tone reproduction without doubling or distortion.

I also provide for distortion-free omnidirectional radiation of high frequency sound with the speaker system described herein. I accomplish this by providing a speaker and plug combination wherein the fixed plug has an exterior configuration which is a mirror image of the shape of the cone of the speaker. The plug is secured with respect to the center of the speaker. In this manner an omnidirectional horn radiator is defined. I have found that because low frequencies are essentially non-directional it is necessary to apply the omnidirectional techniques noted above only to the middle and high frequency portions of the audio spectrum. This is significant because the movement of the cone in the "piston" range of frequencies—with entire cone action—prevents placement of the plug in an effective position to form the throat of a horn in which the cone forms one wall of the horn.

It has been recognized that the horn system is a highly effective system for reproduction of sound. The superiority of a properly designed horn system lies in its complete freedom from transient generation over a wide range of frequencies plus excellent acoustic efficiency. The greater acoustic efficiency of the horn structure allows the associated amplifier to be operated at a lower level and lower distortion will occur for a given acoustic output.

The use of the horn structure and the cabinet structure set forth herein combine to provide a speaker system which is compact and yet produces true sound over the complete audio range.

One form of loudspeaker system utilizing the concept set forth is schematically illustrated at 10 in FIGS. 1-4 and has a cabinet 11 with exterior side walls 12, 14, 16 and 18 and top and bottom closures 20 and 22.

A speaker chamber 21 is disposed above the acoustical cabinet 11 and is provided for mounting of the speaker assembly and definition of acoustical means for production and dispersion of sound, as desired.

Placing a speaker mechanism in a cabinet is a method of reducing over-all baffle dimensions to reduce or eliminate resonance distortion. One most prominent effect in doing this is the inherent cabinet resonance. This effect must be noted since it combines with the resonance of the speaker to determine the low frequency characteristic of the speaker system. In most inexpensive speaker cabinets the cabinet resonance and the speaker resonance are about the same. With their resonances being close the result is a combined peak which may be 10 db, or more. That gives rise to the commonly noted booming tone of speaker systems. Also, it causes transient oscillations which tend to make all bass notes sound the same, no matter what instrument originated the note. I have eliminated this characteristic while still retaining an inexpensive and compact cabinet structure.

Figure 3:
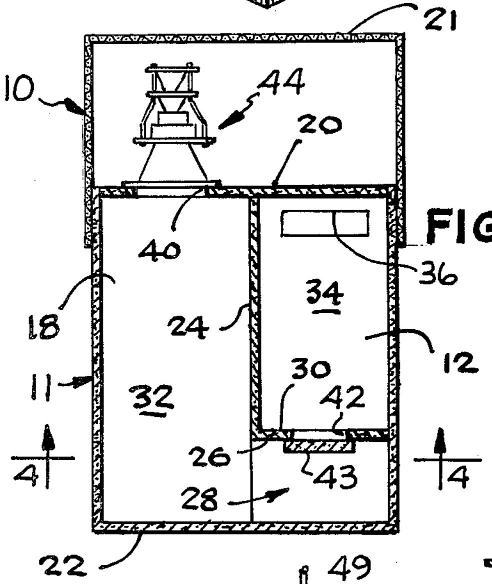
FIG. 3 is a sectional view of the loudspeaker system illustrated in FIG. 1 taken along the line 3—3 of FIG. 1.
Figure 4:
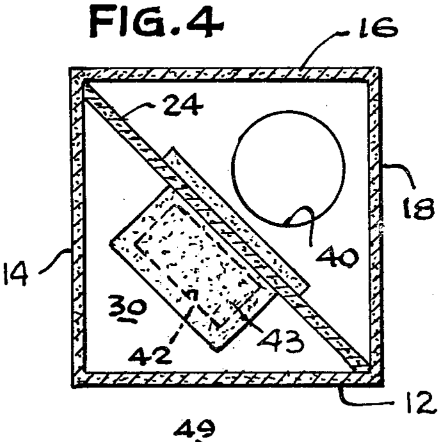
FIG. 4 is a bottom view of the speaker cabinet taken along lines 4—4 of FIG. 3 illustrating the construction of the cabinet.
Figure 7:
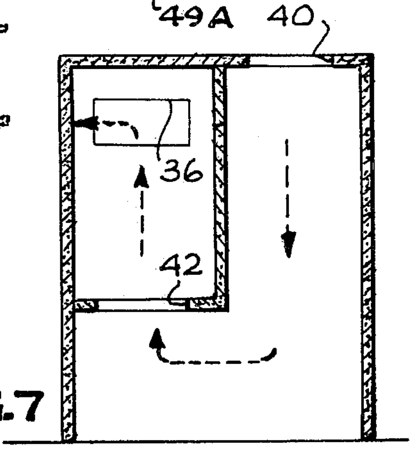
FIG. 7 is a sectional view of the cabinet of FIGS. 1 through 4 in the plane of FIG. 3; schematically illustrating the acoustical path through the cabinet of the speaker system.

As seen in FIGS. 3, 4 and 7, the acoustical cabinet structure 11 is provided with a partition 24 extending diagonally across the acoustical cabinet from the top 20 thereof to terminate therein at a plane spaced from the bottom 22 of the cabinet to define the lower terminal 26 of the partition whereby a passage 28 is defined between the bottom closure 22 and the lower terminal 26. A further wall 30 is secured within the cabinet 11 between the terminal 26 of the partition 24 and the side walls 12 and 14 to strengthen, stiffen and support the partition 24. This folded duct tube-type enclosure is designed to reduce cone resonance by the loading action of a tuned air column. The loading value, by adjustment and design, can be made to cancel the normal resonant response of the speaker to omit distortion in use of the speaker system.

The cabinet 11, with partition 24 and wall 30 defines an acoustical path from the opening 40 to the openings 36 and 38 provided in the side walls 14 and 12, respectively. This defines partitioned areas 32 and 34 within the acoustical cabinet 11. The length of the duct defined axially along the length of the area 32, beneath the terminal 26 through the passage 28 and along the area 34 to the openings 36-38 is 1/12 of the wavelength of sound at the natural free air resonance of the low frequency speaker of the system.

The walls, top and bottom closures and the partitions are of any suitable sound absorbing material. In one particular cabinet structure I employed, with excellent results, a material identified as Homasote which is a dense paper, pulp material having high sound energy absorbing characteristics.

In any quality cabinet structure, rigid construction must be employed to avoid inherent vibration, buzzing or rattle of the cabinet in use. The materials I have selected are well suited to this type of construction. If such construction is not employed each panel will, in effect, become a vibrating diaphragm which may easily be driven by the speaker.

The top closure or wall 20 of the cabinet 11 is provided with an opening 40 above which the speaker assembly is mounted.

The partition 30 is provided with an opening 42 to define a passage from the area 32 to the area 34. An appropriate acoustical absorbing material 43 is placed over the opening 42 to prevent transient oscillations in the system and to assure that the loading value is not altered by distortive action. One such sound absorbing material is Feltex.

The speaker assembly 44 is schematically illustrated in FIGS. 3, 5, 5A and 6 and includes the speaker magnet 46, high frequency speaker 48 and low frequency speaker 50.

The speaker assembly 44 is mounted above the acoustical cabinet 11 with the high frequency speaker 48 facing upwardly within the speaker chamber 21. The high frequency speaker 48 is designed such that the sound radiating therefrom is directed at approximately a 30° angle with respect to the top of the cabinet. This assures that the weak, high frequencies will be directed above the furniture normally in the home and will not be lost or diminished in any way. As is common in the art, a suitable gasket is placed between the cabinet 10 and the mounting means for the speaker assembly 44 to assure an air tight seal therebetween.

The low frequency speaker 50, as noted above, is mounted in back-to-back relation with the high frequency speaker 48 of the assembly 44. The speaker 50 faces toward the area 32 of the cabinet 10 and is mounted over the opening 40 in the cabinet. As schematically represented in FIG. 7, the sound energy from the low frequency speaker 50 travels along the area 32, through the passage 28, opening 42, area 34 and out through the openings 36 and 38. The areas 32–34 define a duct-like structure which, as noted herein, is 1/12 of the length of a wavelength of sound at the natural free air resonance of the speaker 50. By use of open end tubes of this length and by placing a suitable acoustical screen or absorbing mass at the opening 42 the resonance in the cabinet and speaker system will be damped. Accordingly, low frequencies may be produced without doubling or other distortion. It should be noted that the acoustical screen may be placed nearly anywhere in the tunnel defined by the areas 32–34. It is included here on the partition 30 for convenience.

The cabinet 11 and speaker system set forth herein provides a natural bass response where various instruments may be distinguished naturally. The concept set forth herein also permits construction of a small system with better sound control without distortion at any frequency.

The high frequency speaker 48 employed in the speaker system illustrated herein may be of any suitable type for this purpose. For example, a three inch diameter cone type tweeter provides adequate physical size to reach a low frequency cut-off below 4000 Hz. In combination with the tweeter in the speaker assembly, a six inch diameter woofer cone type speaker provides adequate physical size to reach a low frequency cut-off below 30 Hz. Speakers of this type easily lend themselves to mounting with the tweeter above the woofer speaker and axially aligned therewith. This construction gives an apparent single source of sound from both speakers.

In the illustrated system, the speaker assembly 44 is comprised of a high frequency speaker 48 and a low frequency speaker 50, in combination, with the speakers 48 and 50 being mounted in back-to-back relation. The speakers selected cover the full audible range of sounds (i.e. 20 to 20,000 Hz).

The system set forth herein involves the use of an omnidirectional high frequency speaker 48 mounted to radiate the sound slightly upwardly with respect to the cabinet so that the sound will radiate above the furniture when the speaker is placed on the floor and will not be dissipated or distorted by the furniture.

Figure 5:
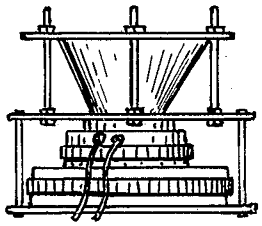
FIG. 5 is a side elevation of the high frequency speaker of the assembly illustrating the magnet, speaker and plug in assembled relation.
Figure 5A:
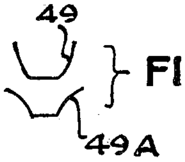
FIG. 5A is a fragmentary enlarged view of the high frequency speaker cone and plug schematically illustrating the inter-relationship therebetween for distortionless sound production.
Figure 6:
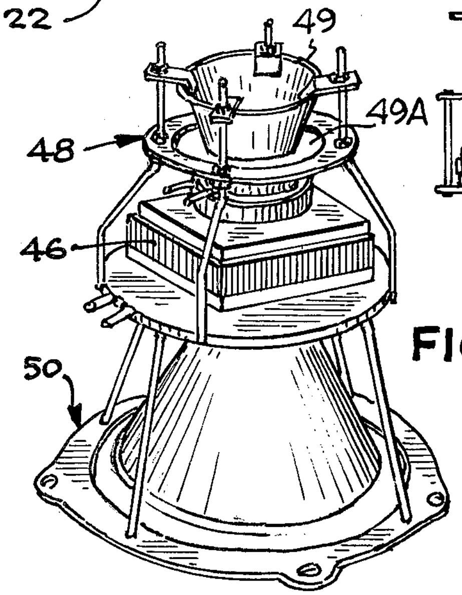
FIG. 6 is a perspective view of the speaker subassembly with the high and low frequency speakers mounted in back-to-back relation.

Also, as illustrated in FIG. 5A, I have provided a speaker assembly which will radiate all frequencies of the speaker 48 uniformly about the speaker without loss or distortion. This is accomplished by use of the plug 49 in combination with the speaker cone 49A of the assembly.

The surface configuration of the plug 49 is generated as a mirror image of the surface configuration of the cone 49A of the speaker 48 so that the two surfaces are complementary in defining a horn-like structure for radiation of sound energy. This improved concept is a departure from earlier concepts in that it provides a 360° radiation pattern. Horn technology itself is old but sound producers of this type generally are highly directional.

The horn structure presents a highly efficient method of sound radiation. In effect the horn acts as an impedance matching transformer so that the correct acoustical load is coupled to the diaphragm of the driver unit.

I have employed a metal horn element 49 in the speaker assembly 48 to avoid sound absorption and utilize a unitary structure with an inherent resonance below the low frequency cut-off of the speaker 48 to avoid vibration or distortion.

With the use of two speakers in the assembly, one for the high and the other for the low-frequency portion of the full range provision must be made to insure that each loudspeaker receives energy only in the intended frequency range. A suitable crossover network is used for this purpose. These networks are known in the art and do not form a separate aspect of the inventive concept set forth here. Accordingly, a specific suitable crossover network, of the many which may be employed, is not illustrated or described since it is well within the province of the art to provide such.

While I have shown and described a specific embodiment of the present invention it will, of course, be understood that other modifications and alternative constructions may be used without departing from the true spirit and scope of this invention. I therefore intend by the appended claims to cover all such modifications and alternative constructions as fall within their true spirit and scope.

What I claim and intend to secure by Letters Patent of the United States, is:

1. An omnidirectional loudspeaker system comprising an enclosure having sound impermeable walls defining a path for the transmission of sound, said enclosure having a first wall at one end of the path provided with a first opening therein, said enclosure having a second wall at the other end of the path with a second opening therein, a speaker mounted on the first wall of the enclosure, said speaker having a cone shaped diaphragm acoustically sealed at its periphery about the first opening, said speaker having natural free air resonance producing sound waves having a wavelength twelve times the length of the path from the first opening to the second opening, and a mass of sound absorbing material disposed within and extending across the path.

2. An omnidirectional loudspeaker system comprising the combination of claim 1 wherein the enclosure is generally rectangular, the first and second walls being walls of the enclosure and the second wall of the enclosure being disposed normal to the first wall, said enclosure having a third wall spaced from and parallel to the first wall and a first partition extending diagonally across the enclosure from the first wall toward the confronting third wall of the enclosure and terminated at a distance from the third wall of the enclosure, the first opening being disposed in the first wall on one side of the first partition, and the second opening being disposed in the second wall on the opposite side of the first partition, and a second partition extending from the end of the first partition opposite the first wall defining a volume about the second opening, said second partition having an aperture extending therethrough, the mass of acoustical absorbing material being disposed over the aperture in the second partition and sealed thereabout.

3. On omnidirectional loudspeaker comprising the combination of claim 1 wherein the cone of the diaphragm is disposed on the side of the first wall of the enclosure remote from the acoustical path with the perimeter of the diaphragm adjacent to the first wall.

4. An omnidirectional loudspeaker system comprising the combination of claim 1 in combination with a high frequency speaker with a cone shaped diaphragm mounted on the first speaker with the cone of the high frequency speaker coaxial with the cone of the first speaker and facing oppositely to the cone of the first speaker.

5. An omnidirectional loudspeaker system comprising the combination of claim 4 in combination with a plug having a generally conical shape mounted on the high frequency speaker with the cone of the plug coaxial and confronting the cone diaphragm of the high frequency speaker and spaced therefrom.

* * * * *